(12) United States Patent
Siddiqi et al.

(10) Patent No.: US 12,340,273 B2
(45) Date of Patent: Jun. 24, 2025

(54) QUANTUM PROCESSOR UNIT ARCHITECTURE FOR QUANTUM COMPUTING VIA AN ARBITRARILY PROGRAMMABLE INTERACTION CONNECTIVITY GRAPH

(71) Applicant: THE REGENTS OF THE UNIVERSITY OF CALIFORNIA, Oakland, CA (US)

(72) Inventors: Irfan Siddiqi, Berkeley, CA (US); Jie Luo, Berkeley, CA (US); Brian Marinelli, Berkeley, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 903 days.

(21) Appl. No.: 17/519,320

(22) Filed: Nov. 4, 2021

(65) Prior Publication Data
US 2022/0138611 A1    May 5, 2022

Related U.S. Application Data

(60) Provisional application No. 63/109,516, filed on Nov. 4, 2020.

(51) Int. Cl.
*G06N 10/40* (2022.01)
*G01R 33/035* (2006.01)

(52) U.S. Cl.
CPC ......... *G06N 10/40* (2022.01); *G01R 33/0358* (2013.01)

(58) Field of Classification Search
CPC ...................................................... G06N 10/40
(Continued)

(56) References Cited

U.S. PATENT DOCUMENTS 9,858,531 B1    1/2018  Monroe
9,922,289 B2 *  3/2018  Abdo ................. H01P 1/20381
(Continued)

OTHER PUBLICATIONS

Britt, Keith A. et al., "High-Performance Computing with Quantum Processing Units", ACM Journal on Emerging Technologies in Computing Systems, vol. 1, No. 1, Article 1, Feb. 2017, pp. 1-13.

(Continued)

*Primary Examiner* — Eric D Lee
(74) *Attorney, Agent, or Firm* — O'BANION & RITCHEY LLP; John P. O'Banion

(57) ABSTRACT

A superconducting quantum processor unit for quantum computing is provided. The processor unit is formed from the union of a qubit chip and a wiring chip with superconducting bonding bumps and spacers. The bumps may be densely distributed around active elements between the two chips and effectively form a Faraday-Cage around the qubits, control signal waveguides etc. The qubit chip has strategically spaced qubits and an inductively coupled probe line and the wiring chip has a bus coupling resonator with a number of voltage nodes and anti-nodes, a resonator pump and at least one SQUID. Magnetic flux applied through the SQUIDs changes their impedances and modifies the microwave boundary conditions of the bus. This allows in-situ shifting of electric field distributions of the resonance modes of the bus along the length of the bus. This tunes the coupling rates of the bus to all qubits simultaneously.

20 Claims, 7 Drawing Sheets

(58) Field of Classification Search
USPC .......................................................... 716/137
See application file for complete search history.

(56) References Cited

U.S. PATENT DOCUMENTS

2014/0097405 A1    4/2014  Bunyk
2022/0058508 A1*   2/2022  Srinivasan ............. G06N 10/40

OTHER PUBLICATIONS

Grumbling, Emily et al., "Quantum Computing Progress and Prospects", The National Academies of Sciences Engineering Medicine, The National Academies Press, 2019, pp. 1-273.

Luo, Jie, "Advanced Quantum Testbed Program", First Annual Stakeholder Meeting, QNL 3D Reconfigurable QPU and Processes R&D, Jun. 10, 2020, pp. 1-13.

Luo, Jie, "Integrating Quantum Optical and Superconducting Circuits with Quantum Acoustics for Scalable Quantum Network and Computation", California Institute of Technology, Pasadena, California, Thesis In Partial Fullillment of the Requirements for the Degree of Doctor of Philosphy, Jul. 1, 2019, 207 pages.

Preskill, John, "Quantum Computing in the NISQ era and beyond", Institute for Quantum Information and Matter and Walker Burke Institute for Theotrical Physics California Institute of Technology, Pasadena, CA 91125, Jul. 30, 2018, pp. 1-20.

* cited by examiner

QUANTUM PROCESSOR UNIT ARCHITECTURE FOR QUANTUM COMPUTING VIA AN ARBITRARILY PROGRAMMABLE INTERACTION CONNECTIVITY GRAPH

CROSS-REFERENCE TO RELATED APPLICATIONS

This application claims priority to, and the benefit of, U.S. provisional patent application Ser. No. 63/109,516 filed on Nov. 4, 2020, incorporated herein by reference in its entirety.

STATEMENT REGARDING FEDERALLY SPONSORED RESEARCH OR DEVELOPMENT

This invention was made with government support under Grant Number DE-AC02-05CH11231, awarded by the U.S. Department of Energy. The government has certain rights in the invention.

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

This technology pertains generally to quantum computing hardware and methods, and more particularly to a quantum processor unit (QPU) architecture for quantum computing via an arbitrarily programmable interaction connectivity graph.

2. Background

Scaling of quantum computing systems requires the development of hardware architectures with quantum circuits of significant complexity and sufficiently low error rates that can coherently store, process, and extract encoded qubit information. However, the noise that occurs in quantum gates has been a substantial limitation to the size of existing quantum circuits.

The scope of scientific problems solvable by a Noisy Intermediate-Scale Quantum (N ISO) quantum processor unit (QPU) is defined by both its gate fidelity and qubit connectivity. Conventional efforts in the domain of NISQ-era superconducting quantum circuits have been focused on improving two-qubit gate fidelities. Despite the recent improvements of two-qubit gate fidelities, the entangling of distant qubits still requires cascading multiple nearest neighbor two-qubit gates, and the overall compound operation error rate grows exponentially with the distance between the qubits on the connectivity graph.

On the other hand, the resource efficiency of a highly connected system has been demonstrated in various AMO quantum simulation experiments. Combining the great controllability and integrability of superconducting quantum circuits with the flexibility of an all-to-all reconfigurable qubit connectivity graph in a large qubit-count processor will greatly accelerate the exploration and demonstration of useful NISQ-era quantum applications. The core challenge faced by building a reconfigurable connectivity graph directly into superconducting quantum circuits is the need to scale up both qubit-count and connectivity while maintaining the high qubit gate fidelity and qubit coherence.

BRIEF SUMMARY

Systems and processes are provided for a superconducting quantum processor unit (QPU) architecture for quantum computing via an arbitrarily programmable interaction connectivity graph. By way of example, and not of limitation, one embodiment the architecture includes no fewer than eight superconducting transmon qubits that are coupled to a common high-quality superconducting meander coplanar waveguide resonator (Bus). Two ends (boundaries) of the bus are connected to the ground plane via two Superconducting-Quantum-Interference-Devices (SQUIDs) respectively.

Microwave waveguides are designed near the SQUIDs that are used for controlling the magnetic flux through these devices during operation. The magnetic flux applied through the SQUIDs will change their respective impedances and modify the microwave boundary conditions of the bus. This allows the in-situ shifting of the electric field distributions of the resonance modes of the bus (mode profile) along the length of the bus. This tunes the coupling rates of the bus to all qubits simultaneously.

By parking the superconducting transmon qubits voltage nodes of the bus resonance mode used for mediating the coupling, the qubits are initially decoupled from the mediating bus resonance mode. The bus-qubit couplings are modulated according to the external drive by spatial modulation of the resonance electric field distribution via modulation of the magnetic flux through the SQUIDs using corresponding control lines.

Since the qubits are dispersively coupled to the common bus, the qubits are mutually coupled through virtual photonic coupling processes. A time-dependent modulated qubit-bus coupling directly produces a time-dependent coupling between all of the qubit pairs. Direct photon exchange interactions are avoided by detuning all of the qubits away from each other.

Parametric photon exchange and pair-creation interactions can be created, on-demand, between arbitrary qubit pairs concurrently. In other words, an arbitrary transverse pair-wise qubit-qubit coupling graph can be programmed and dynamically created via multiplexing desired phase-locked frequency components into the flux control line drive of each bus SQUID to produce a given qubit spectral distribution (tunable by their respective Z-control lines) in real-time.

One aspect of the architecture is its unique ability to address the need for creating an arbitrary and reconfigurable transverse 2-body interaction graph between all qubits on-demand without requiring sophisticated wiring. This is extremely hardware efficient with a limited on-chip complexity increase and it is versatile, since the complicated and dynamic connectivity graph is fully determined and encoded in the frequency-phase domain of the multiplexed microwave drive from room-temperature controller electronics to the SQUIDs of the bus.

Another aspect of the technology is that it greatly reduces the overhead of synthesizing interactions between qubits geometrically to be far from each other, as is commonly seen in traditional lattice-based quantum processor units that have an intrinsic 2D or 1D lattice nearest neighbor connectivity graph. The circuit is suitable for seeking NISQ-era quantum applications.

A further aspect of the technology is its embedded bosonic encoding capability. In one embodiment, the technology has a fully controlled bus resonator which is coupled to a mode matched microwave pump line that allows the creation of bosonic encoded states in the bus resonator and studying bosonic encoding interfacing with spin encoding in the transmon network.

According to another aspect of the technology, a superconducting quantum processor unit is provided wherein boundary conditions of one or more coupling resonators in the quantum processor unit are modifiable through magnetic flux tuning wherein the resonant field geometric shape can be modified for a given magnetic flux.

In one embodiment, a superconducting quantum processor unit is provided that includes no fewer than eight superconducting transmon qubits that are coupled to a common high-quality superconducting meander coplanar waveguide resonator. In another embodiment, the superconducting quantum processor unit includes a squid tunable multimode bus resonator that is coupled to all of the qubits in the processing unit to enable parametric coupling and the resonator acts as the central coupling component for multi-qubit interactions over the full tuning range. The multiplexed microwave signals also control the qubit connectivity graph.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWINGS

The technology described herein will be more fully understood by reference to the following drawings which are for illustrative purposes only.

DETAILED DESCRIPTION

Referring more specifically to the drawings, for illustrative purposes, a superconducting quantum processor unit architecture that includes no fewer than eight superconducting transmon qubits that are coupled to a common high-quality superconducting meander coplanar waveguide resonator (Bus) are generally shown. Several embodiments of the technology are described generally in FIG. 1 to FIG. 7 to illustrate the characteristics and functionality of the devices, systems, and methods. It will be appreciated that the methods may vary as to the specific steps and sequence and the systems and apparatus may vary as to structural details without departing from the basic concepts as disclosed herein. The method steps are merely exemplary of the order that these steps may occur. The steps may occur in any order that is desired, such that it still performs the goals of the claimed technology.

Superconducting chip architectures with eight and sixteen qubits are used to generally illustrate the platform structure and operating principles. The scalable chip architecture allows dense wiring with low crosstalk and high qubit connectivity directly embedded at the hardware level. In these illustrations, several strategies in design and fabrication are used to tailor the electromagnetic environment of the waveguides and quantum elements to mitigate the issue of increasing crosstalk levels due to dense wiring.

Figure 1:
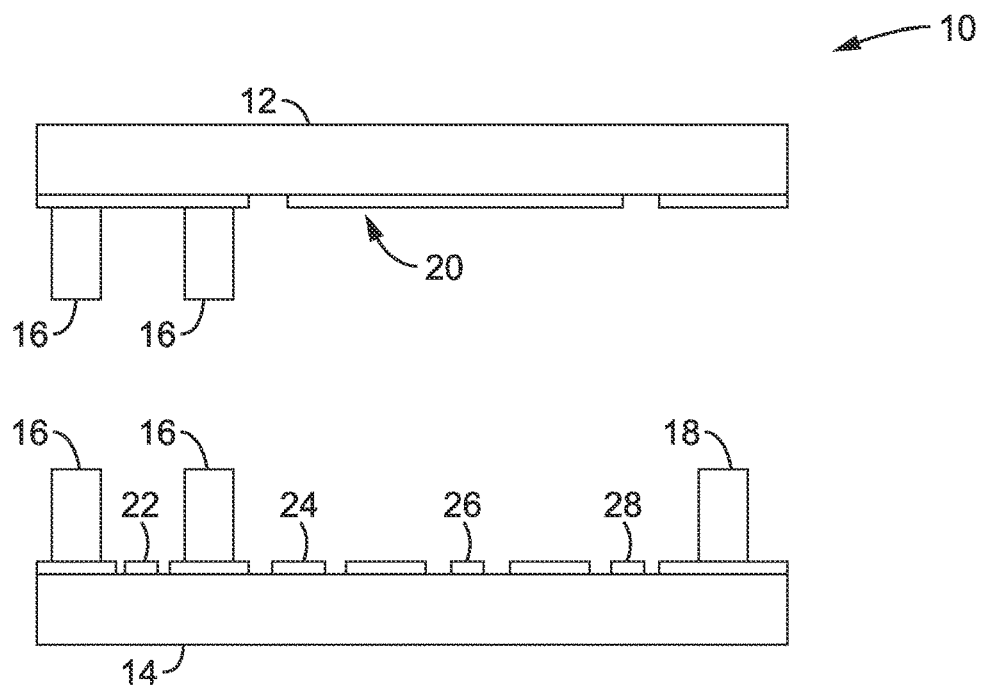
FIG. 1 is a schematic cross-sectional exploded view of a qubit-chip and a wiring-chip that are coupled to form a processor chip according to one embodiment of the technology.

Turning now to FIG. 1, an embodiment of the basic chip architecture 10 and structural elements is shown schematically. A flip-chip architecture is preferably used to overcome the limitations of a single planar structure. This chip structure is one device created from coupling two silicon chips. The two chips are capacitively, inductively, and galvanically connected so that signals from one chip can pass to the other chip. This vertical routing in a 3D structure allows the spatial separation of signals and elements from each other and to pass signals over each other without significantly increasing the crosstalk level. This structure is preferably adopted because interfacing qubits and other elements using planar waveguides will inevitably require signal lines to pass over each other and even different quantum elements as the density of planar wiring increases in the production of more and more complicated devices. Surprisingly, it was found that the crosstalk level between waveguides is directly reduced when they are separated on different chip surfaces. This is because a parallel plate effect makes the waveguide's electric field energy concentrated in the gap space above the center trace and a reduced lateral field distribution. Furthermore, there is significantly reduced inductive coupling between waveguides that are located on different surfaces due to the lack of a common superconducting current path.

As shown in the generalized cross-sectional structure of FIG. 1, the chip architecture is formed from the coupling of a qubit-chip 12 and a wiring-chip 14. In the embodiment shown, the qubit-chip 12 and wiring-chip 14 have bonding points 16 and spacers 18 to provide positional orientation and points of contact between the two parts of the final chip structure. The superconducting metal Indium is preferred as the metal for creating the bonding bump points 16 on the two chips to be bonded together (shown in the layout figures as dots). In one embodiment, the bonding bumps are approximately 15 μm in diameter and are circular or square in shape and about 3 μm to about 5 μm in height. The bonded bumps are densely distributed around the active elements between the two chips and effectively form a Faraday-Cage around the qubits 20, control signal waveguides and other chip components.

The spacers 18 between the wiring 14 and qubit 12 chips are preferably made from niobium or similar metal. The preferred low-loss superconducting/dielectric hard spacers have dimensions of about 150 μm×150 μm and are between approximately 3 μm to 5 μm in height.

In this illustration, all the control waveguides are located on the bottom wiring chip 14 and the superconducting Josephson junction qubits 20 are located on the upper chip and the Faraday-Cage that is formed in the gap between the two chips nearly eliminates the crosstalk talk between the control lines of one qubit and a nearby qubit. The readout waveguide 22, readout resonator 24, Z-control line 26 and XY-control lines on the wiring chip 14 are also shown schematically in FIG. 1.

Another strategy incorporated in the chip architecture is the use of a micro-bridge (airbridge). The airbridge features are densely and uniformly distributed along the length of the waveguides, for example. The airbridge features are very effective in diminishing the asymmetric field (slot-line mode) radiation losses of the bus resonator and form another layer of Faraday-Cage around all of the lines in the bottom wiring-chip 14. The elimination of crosstalk with these features has been shown to be significant. Furthermore, the airbridges can not only limit the lateral distribution of electric fields that induce crosstalk between waveguides and elements that are not directly on top of each other (lateral crosstalk between chips), they also nicely form a vertical Faraday-Cage that eliminates the crosstalk between elements that are directly on top of each other (vertical crosstalk between chips). This means that it is possible to not only wire the control wirings with greater density but also to wire them to pass each other without increasing the level of crosstalk in the control and qubit systems.

Although these strategies successfully eliminate parasitic crosstalk between lines and elements on different chips of the flip-chip device, crosstalk channels between elements on the same silicon chip may still remain. For example, the qubits on the same silicon chip (i.e. qubit-chip 12) can still be parasitically coupled to each other via their electric field distribution in the silicon substrate. One strategy to eliminate the crosstalk on the same silicon chip is the creation of a dense grid of Through-Silicon-Vias in the substrate from the backside of the silicon chip (not shown). In one embodiment, these structures are fabricated with a high-aspect ratio RIE silicon deep etch (Bosch process) followed by superconducting/normal metal sputtering/CVD deposition from the back side before patterning the high-quality front side with superconducting Nb.

In sum, the aforementioned strategies provide several benefits including: (a) low-inductance grounding of the metalized layer due to short electric path length and large total contact areas with packaging ground as compared to the traditional wire-bonding technique; (b) elimination of dominant crosstalk channels via the substrate between control lines on the wiring chip; (c) improved thermalization of the wiring chip metalized layer with packaging; (d) potential quasi-particle drains to channel quasi-particles deep inside the processor directly into the metal packaging; and (e) the ultimate solution to practical scalability and reliability challenges associated with wire-bonding hundreds of wires between packaging PCB and the wiring chip.

By employing wiring controls off of the chip, future large-scale QPUs can be connected to PCBs via a socket design similar to the Land Grid Array (LGA) socket found on all conventional PC motherboards. This not only guarantees the ease and reproducibility of mounting chips to packaging but also minimizes crosstalk between bonding points by keeping a relatively large distance for a given chip footprint and a required number of bonding points as compared with wiring-bonding on the edges of the chip (2D grid vs 1D line).

Figure 2A:
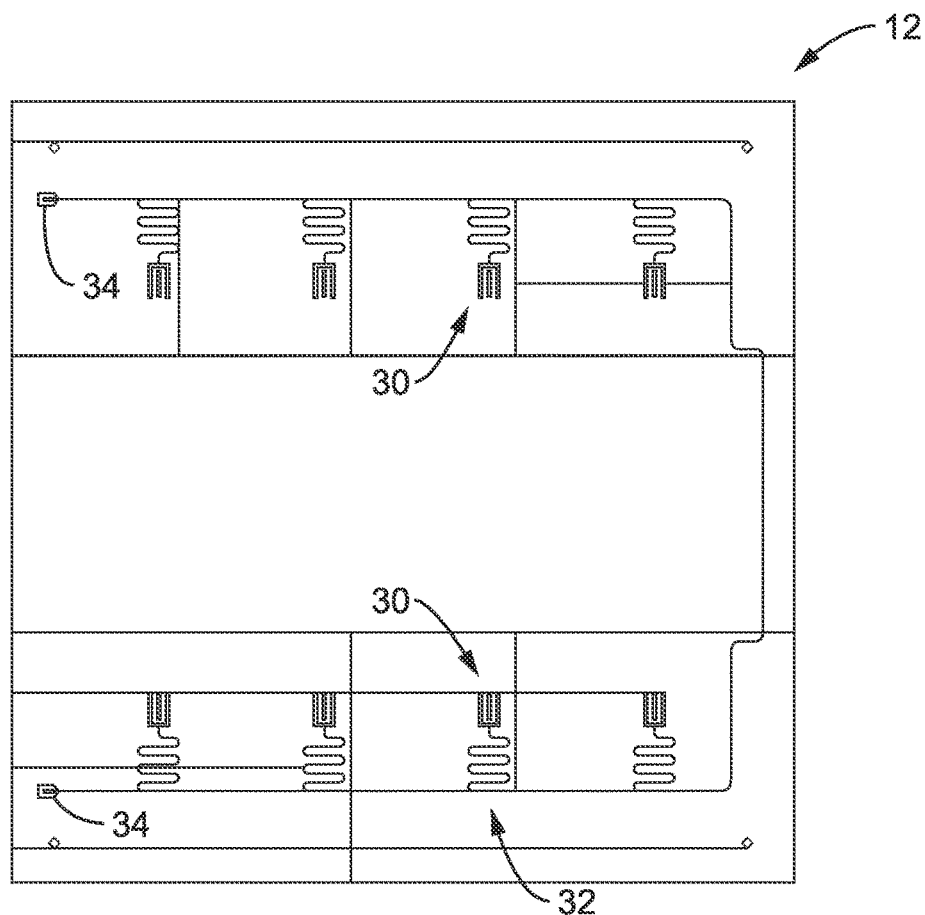
FIG. 2A is a schematic top view of a qubit chip with 8 qubits with the Indium bumps and Nb spacers removed for clarity according to one embodiment of the technology.
Figure 2B:
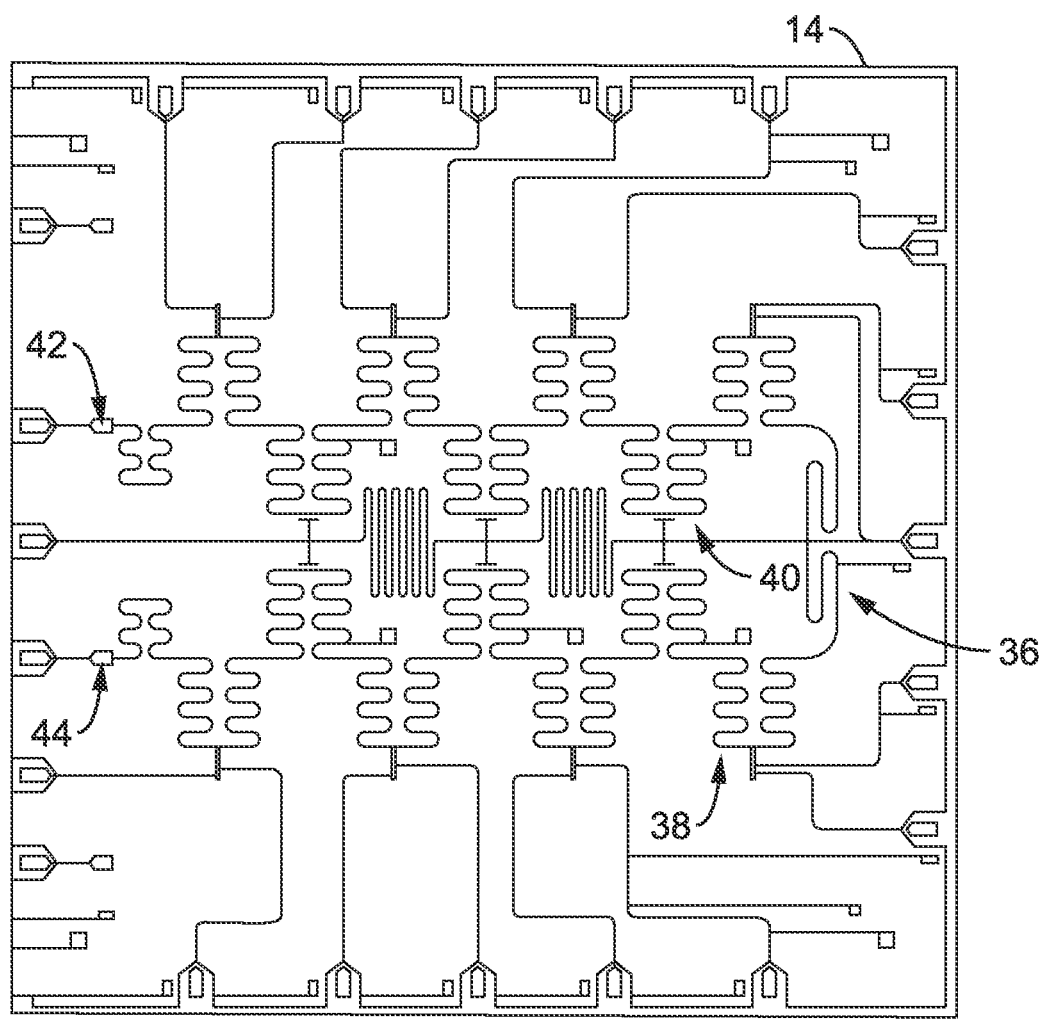
FIG. 2B is a schematic top view of a wiring chip that contains the bus elements that is configured to orient and couple with the qubit chip and with the isolating bumps and spacers removed for clarity.

Referring also to FIG. 2A and FIG. 2B, detailed schematic views of an 8-qubit chip 12 and wiring chip 14 show the qubit spacing and readout bus configurations respectively. In the embodiment of the qubit chip 12 shown in FIG. 2A, the individual qubits 30 are preferably equally and symmetrically spaced on the chip 12. The readout resonators of qubits 30 are preferably inductively coupled at voltage nodes 32. Parallel plate capacitive couplings 34 are also shown.

The wiring chip 14 of FIG. 2B shows the generally symmetric bus 36 with outer bus coupling resonators 38 with nodes and anti-nodes separated by a bus drive pump 40. The two ends (boundaries) of the bus coupling resonators 38 of the bus 36 are connected the ground plane via two Superconducting-Quantum-Interference-Devices (SQUIDs) 42, 44 respectively. The SQUIDS allow tuning of the Bus frequency and mode spatial profile.

Figure 3A:
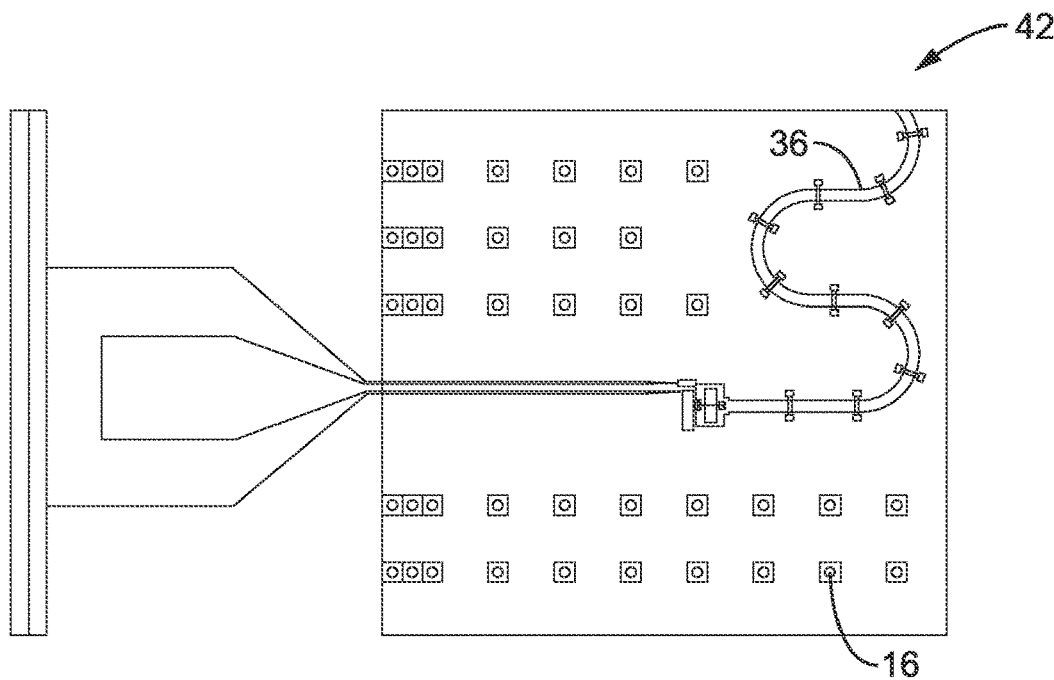
FIG. 3A is a schematic top view of one flux control waveguide with a SQUID device attached to the bus of the wiring chip.
Figure 3B:
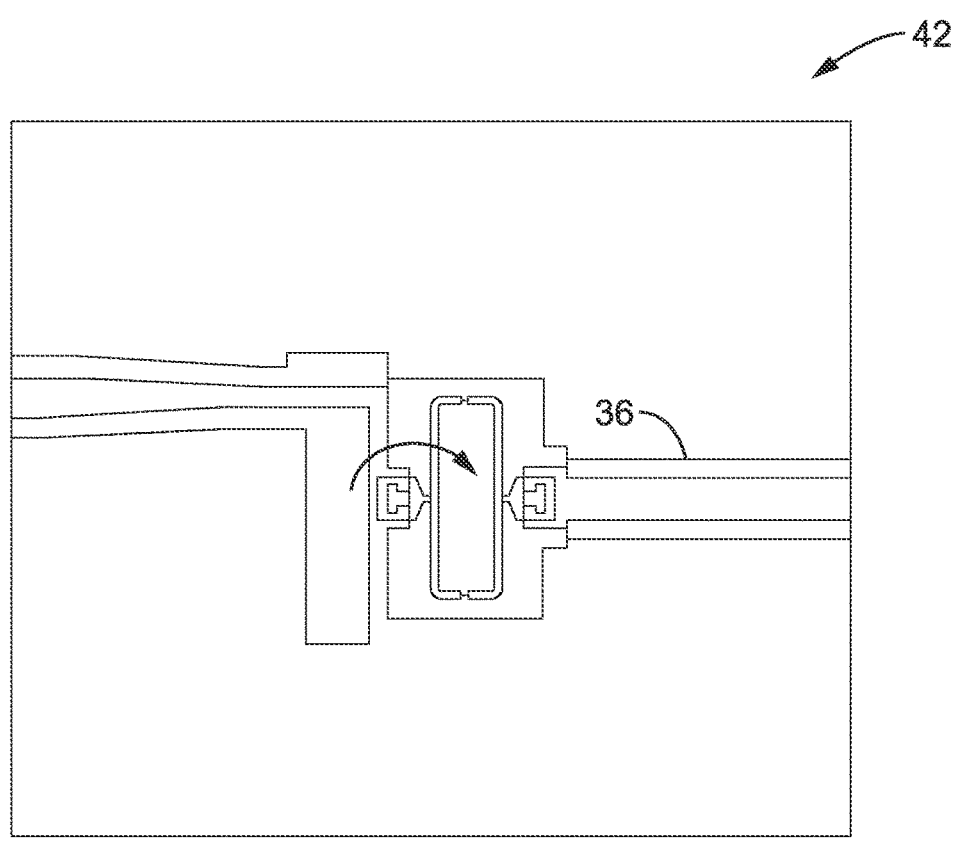
FIG. 3B is a detailed schematic top view of the SQUID device of the flux control of FIG. 3A.

FIG. 3A and the detail of FIG. 3B show one of the SQUID devices 42, 44 that are attached to the bus 36. In the expanded figure of the SQUID of FIG. 3B, on the right, it can be seen that the microwave waveguides are designed near the SQUIDs and used for controlling the magnetic flux through these devices during operation. The magnetic flux $\Phi$ applied through the SQUIDs is indicated by the arrow and it will change their respective impedances and modify the microwave boundary conditions of the Bus. The impedance of one of the SQUID's can be written as $$Z_{SQUID}(\Phi) = 1 \Big/ \left( i\omega C_{SQUID} + \cos\left(\pi \frac{\Phi}{\Phi_0}\right) \Big/ i\omega L^0_{SQUID} \right)$$

where $\Phi_0$, $C_{SQUID}$, $L_{SQUID}^0$ are magnetic flux quantum, the SQUID' total Josephson Junction capacitance, and the SQUID's total Josephson Junction inductance. This allows the in-situ shifting of the electric field distributions (mode profile) of the resonance modes along the length of the bus 36. This phenomenon can be analytically captured and plotted. The plot indicates that the resonance mode profile's quantum zero-point-fluctuation (ZPF) voltage amplitude profile translates left or right as the magnetic flux (represented by the value of $$\pi \frac{\Phi}{\Phi_0})$$

through the two SQUIDs ($squid_1$ and $squid_2$) is changed.

To tune the fluxes through the two SQUIDs, the mode profile of the bus resonator is geometrically shifted without changing the frequency of the resonance mode while limiting the generation of parasitic sidebands and ensuring the qubit-bus modulation is the same for different qubits at different locations along the length of the bus resonator as well as keeping the bus resonance mode frequency fixed.

By plotting out the interested bus mode's resonance frequency as a function of the fluxes (represented with the value of $$\pi \frac{\Phi}{\Phi_0})$$

through the two SQUIDs, approximate equal-frequency contours can be identified. The produced graph has opposing asymptotic curves. If the fluxes through the two SQUID loops are controlled in a way that moves along one of the identified contour lines, the bus resonator's coupling mode's frequency won't change significantly, and the corresponding wavelength will stay approximately the same along the chosen line. In this way, the boundary conditions that are controllably modified by the two SQUIDs will only geometrically shift the mode's electric field distribution along the length of the bus 36.

For example, if a straight diagonal line is plotted in the middle between the curves, an operation points can be identified along the line. In one embodiment, the operation point is at the desired 6 GHz and has the desired electric field distribution at the point from simulations of the placement of qubits at the voltage nodes of the bus resonance mode with the two SQUIDs' fluxes tuned to $$\pi \frac{\Phi_{1,2}}{\Phi_0} = 0.5\pi).$$

The eigen mode field distribution may be predicted with a finite-element-method (FEM) simulation.

Accordingly, as the capacitive coupling rate between a transmon qubit and the bus mode is proportional to the ZPF voltage of the bus mode, the geometric shift of the ZPF voltage mode profile directly tunes the coupling between the bus and the transmon qubit depending on the geometric location of the transmon qubit along the length of the bus resonator.

In this illustration, solving for the waveform along the length of the meander resonator, it is possible to accurately calculate the coupling rate of the phase matched bus bumps to the distributed $8_{th}$ order coupling mode to $K_{ex}^{bus}=2\pi \times 1.24$ kHz as both SQUIDs are biased around the $\pi/2$ point. It is also possible to calculate $k_{ex}^{bus}$ as a function of fluxes through the two SQUID loops.

Figure 4A:
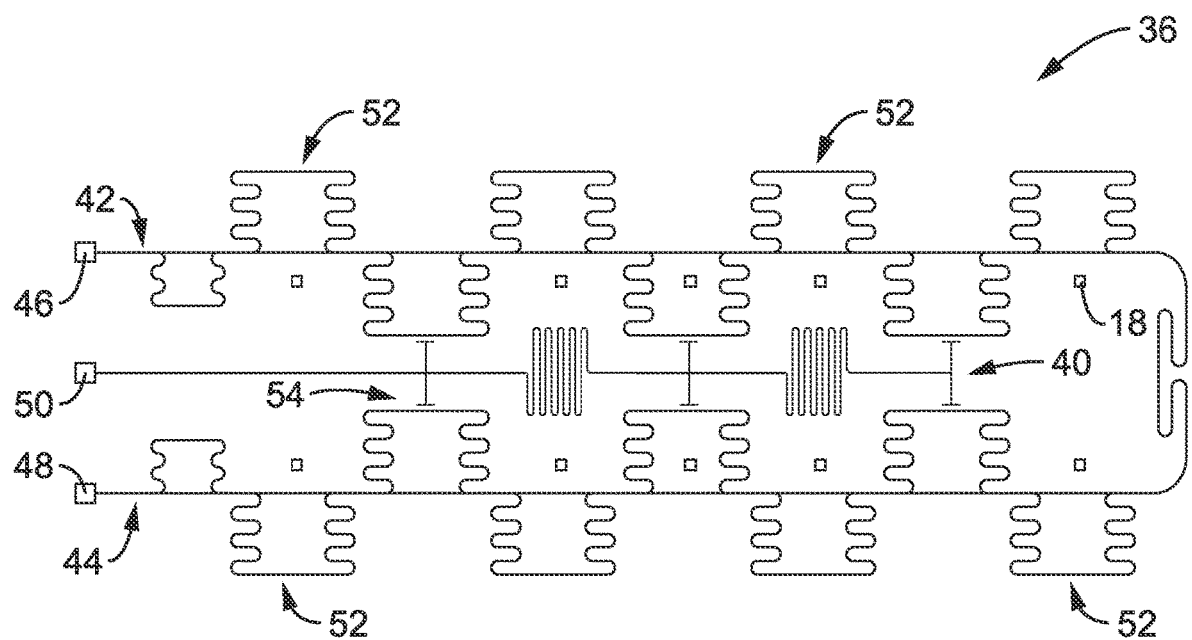
FIG. 4A is a schematic top view of the bus architecture isolated from the wiring chip for clarity according to one embodiment of the technology.
Figure 4B:
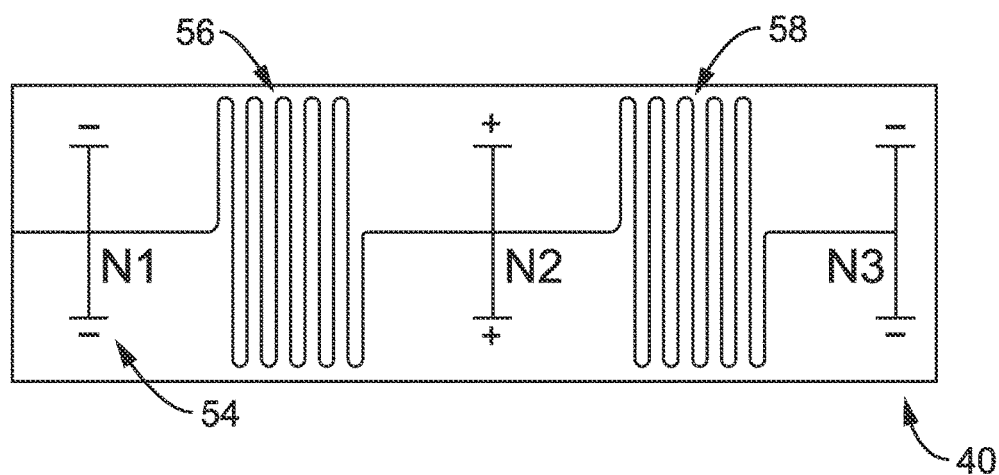
FIG. 4B is a schematic top view of the phase matched pump component of the bus isolated for clarity.

An isolated view of one preferred bus design 36 and phase matched pump 40 are shown in FIG. 4A and FIG. 4B. Two ends (boundaries) of the bus 36 are connected to the ground plane interface 46, 48 via two Superconducting-Quantum-Interference-Devices (SQUIDs) 42, 44 respectively. The pump 40 is centered between the voltage nodes and anti-nodes of the bus coupling resonators 38 of the bus 36 structure and connected to a drive interface 50. One or more qubits are placed at the voltage nodes 52 of the of the resonator structure of bus 36. The phase matched pump 40 is associated with the nodes of the bus resonator structure with bus-pump coupling capacitors 54.

Figure 5:
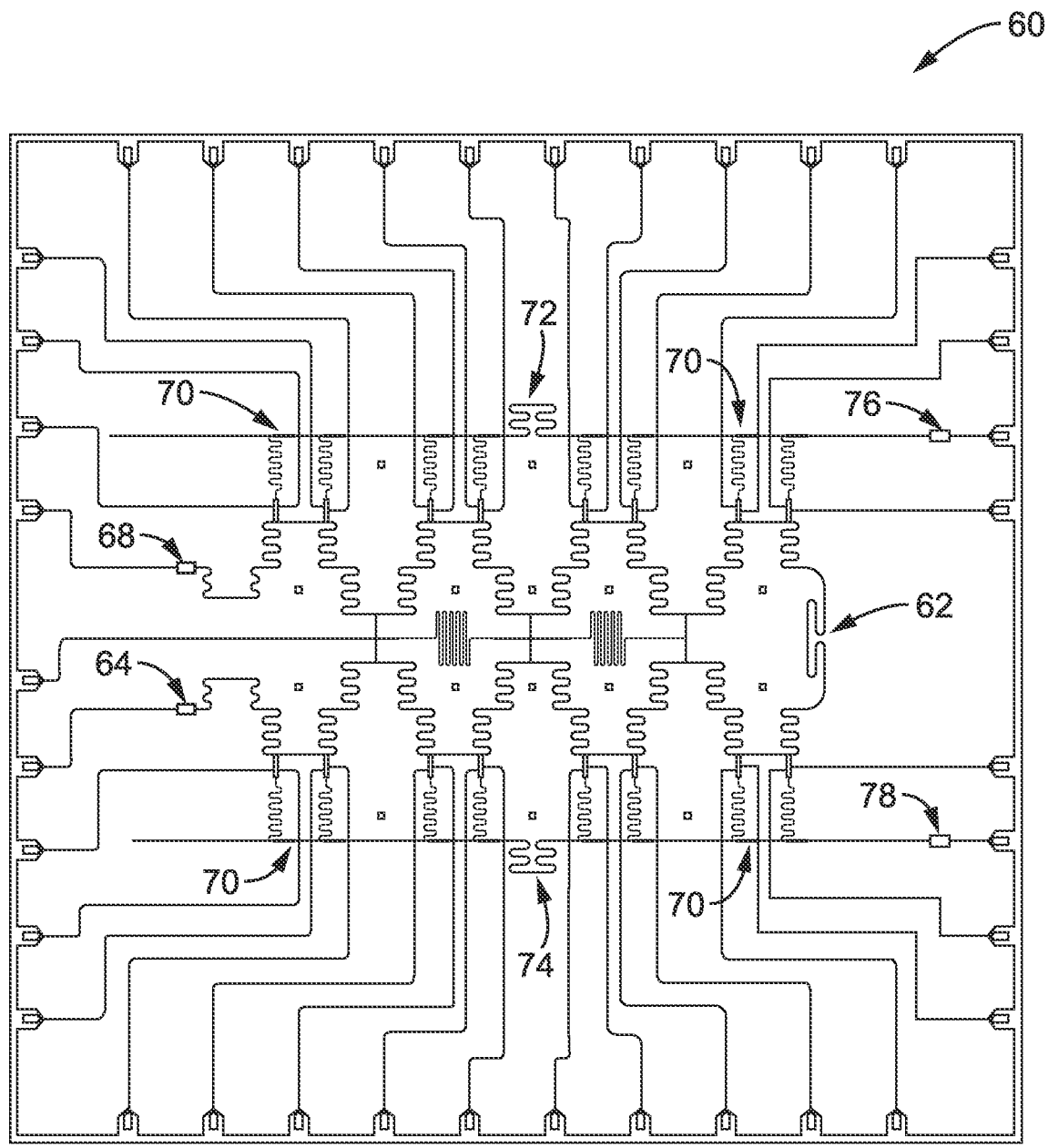
FIG. 5 is a schematic top view of processor chip with the 16-qubit chip coupled with the wiring chip with the bus structure visible to show orientation and spacing according to an alternative embodiment of the technology.

Referring also to FIG. 5, by placing the superconducting transmon qubits at voltage nodes 52 of the bus resonance mode used for mediating the coupling, the qubits are initially decoupled from the mediating bus resonance mode. The bus-qubit couplings may be modulated according to an external drive by spatially modulating the resonance electric field distribution via modulation of the magnetic flux through the SQUIDs 42, 44 using corresponding control lines. It has been shown that the parametric coupling between qubits 30 and the tunable coupling bus 36 can be generated via applying flux modulation to the bus's SQUIDs at the boundaries. The parametric coupling rate has been shown to increase with increasing modulation amplitude and decrease with detuning between the qubit 30 and coupling bus 36.

Since the qubits 30 are dispersively coupled to the common bus 36, qubits 30 may then be mutually coupled through a virtual photonic coupling process. A time-dependent modulated qubit-bus coupling directly leads to a time-dependent coupling between the all qubits or qubit pairs which become clear after a time-dependent Schrieffer-Wolff transformation that is used to eliminate the unexcited bus mode's degree of freedom. Direct photon exchange interactions are avoided by detuning all of the qubits away from each other. Parametric photon exchange and pair-creation interactions can be created, on-demand, between arbitrary qubit pairs concurrently. In other words, an arbitrary transverse pair-wise qubit-qubit coupling graph can be programmed and dynamically created via multiplexing desired phase-locked frequency components into the bus SQUIDs' flux control line drive for a given qubit spectral distribution (tunable by their respective Z-control lines) in real-time.

In one illustration, two tones with frequency $\omega_1$ and $\omega_2$ were mixed into one magnetic flux modulation applied to the boundary SQUIDs of the tunable bus resonator and implemented a Raman process for qubit-qubit parametric coupling. This process requires $\omega_1+\omega_2=|\Delta_{qq}|$ where $\Delta_{qq}$ is the qubit-qubit detuning. This demonstrated that the qubit-qubit parametric process that is mediated by the tunable resonator can be programmed via RF frequency multiplexing.

This architecture not only allows the direct modulation of couplings between qubits for creating parametrically engineered two-body transverse couplings, it also allows for interfacing bosonic encoding (continuous variable encoding of quantum information) with spin-based encoding (two-level system or three-level system encoding of quantum information). The high-quality bus resonator that is used to mediate the second order coupling between qubits also has a first order coupling with all of the qubits.

As can be seen in the layout of FIG. 4B, this architecture preferably also incorporates a phase matched drive 40. Three bus-pump coupling capacitors 54 are present on both sides of the pump drive 40 and are labeled N1-N3 in FIG. 4B. It can be seen that the bus drive 40 has the N1 and N3 always in phase and N2 always pi-out-of-phase with N1 and N3. This is intentional and uniquely enabled by the meandered structure 56 between N1 and N2 and the structure 58 between N2 and N3. These meandered waveguides 56, 58 are the phase delay lines. As N1, N2, N3 are also positioned at the voltage anti-nodes of the bus resonator's coupling mode of interest (e.g. at 6 GHz), this design aligns the voltage phases of the resonant anti-nodes with the traveling wave injected into the bus drive line/interface 50.

This alignment enforces a strong spatial selection rule for the pump to strongly drive a particular resonant mode profile. This, together with spectral selectivity, uniquely allows one to drive the desired mode with a certain profile almost exclusively without exciting nearby resonant modes that are 750 MHz away from the 6 GHz mode of interest, for example.

The pump drive 40 can be used to strongly drive the mode of interest into a driven stabilized cat state by first hybridizing the bus (e.g. 6 GHz) mode with a transmon qubit (by tuning the qubit frequency to the bus frequency). Due to the programmable modulated parametric interactions between the bus mode and the remaining detuned qubits, entanglement gates can be implemented between the continuous variable cat state and the state encoded in the superconducting qubits (and qutrits).

One important aspect of the architecture lies in its unique ability to address the need for creating an arbitrary and reconfigurable transverse 2-body interaction graph between all qubits on-demand without requiring sophisticated wiring. This is very hardware efficient with a limited on-chip complexity increase and is versatile since the complicated and dynamic connectivity graph is fully determined and encoded in the frequency-phase domain of the multiplexed microwave drive from room-temperature controlling electronics to the bus SQUIDs 42, 44. It also greatly reduces the overhead of synthesizing interactions between qubits geometrically far from each other as commonly seen in traditional lattice-based quantum processor units that have an intrinsic 2D or 1D lattice nearest neighbor connectivity graph. Furthermore, this design also directly enables an efficient way to interface and entangle continuous variable encoded quantum information with spin encoded quantum information within the device.

Not only can the bus coupling resonator be used as a passive element which mediates the coupling between qubit pairs, it can also be utilized as an active element for interfacing continuous variable qubit with multiple superconducting transmon qubits. The bus resonator pump 40 design can be naively used to calibrate the bus flux modulation controls by measuring the bus resonance responses with reflection measurements through the pump line. In order to make the pump useful in selectively driving a stabilized cat state at the 8th order 6 GHz bus mode, it may be necessary to increase the pump-bus coupling rate and use microwave pump-mode phase matching to implement spectrally and spatially selective drive. The increase in rate can be implemented easily by the use of a wider bus-pump coupling capacitor 54 head design, for example.

An alternative embodiment of a quantum processor chip 60 with the qubit chip mounted to the wiring chip is shown schematically in FIG. 5 with the configuration of the wiring chip visible through the qubit chip to show the orientation of the components of the qubit and wiring chips. The composite chip 60 in this embodiment has 16-qubits but uses a very similar bus structure 62 as that described with the 8-qubit chip, including the two SQUIDs 64, 68. The chip 60 shown in FIG. 5 has an upper row of eight qubits 70 and a lower row of eight qubits 70 organized in pairs and associated with the bus 50. The upper row and lower row of qubits 70 each have an external probe line and an optional Purcell filter 72, 74 that can interface with an external off-chip readout line.

It is important to note that the reconfigurable parametric transverse coupling graph is generated by dispersive couplings between an appropriate microwave resonance mode and all the transmons of the qubits 70. Since the bus 62 needs to be a multimode meander CPW resonator for the desired spatial distribution of the coupling resonance mode near the transmon frequencies, special attention needs to be paid to keeping a sufficiently large free-special-range (FSR) for the bus resonator. Otherwise, a small FSR will introduce alternative quantum paths for transverse couplings between qubits via other modes of the bus 62 resonator that are not controlled in a desired way. Such parasitic couplings and quantum state transfer processes mediated by those modes are generally detrimental coherent noises for realizing high fidelity quantum gates between transmons.

Scaling up the processor from 8 qubits to 16 qubits, however, cannot be accomplished by simply doubling the length of the coupling bus resonator since it would half the FSR from 750 MHz to 325 MHz. Accordingly, the size of meander resonator is not extended in order to maintain the FSR to the original 750 MHz in order to avoid complicated dynamics related to multimode virtual coupling between superconducting qubits.

Furthermore, the increase in the number of transmons makes the frequency crowding issue even more severe. To compensate for this, the flat regions of the voltage nodes and anti-notes of the bus resonators were extended by approximately 100 μm to 300 μm. Since such an extension is still extremely subwavelength, the bus coupling mode field distribution in these regions are approximately uniform. This increases the available space to place two transmon qubits 70 in parallel with each other for each bus resonator's voltage node region as seen in FIG. 5.

This spacing is comparable to conventional processors and does not lead to a significant increase in qubit-to-qubit crosstalk levels between nearest transmons thanks to the placement of airbridges and indium bumps between them. Control lines are also effectively shielded by airbridges, and indium bumps that control-qubit crosstalk levels.

Furthermore, the Z-control and XY-controls are intentionally arranged alternatively in regions where lines are closed near transmons. This further removes the concern for control-to-control crosstalk since the Z-controls are shorted to ground near transmons leading to a voltage node and XY-controls are open circuit near transmons leading to a voltage anti-node. The control heads near transmons are intrinsically phase-mismatched and thus uncoupled. Moreover, the Z-controls and XY-controls are spectrally separated by GHz. Therefore, even a finite crosstalk level between Z-control and XY-control will not cause noticeable issues for transmons.

The desired coupling mode frequency is preferably approximately 6 GHz so that the bus resonator mode is at the center of the transmon tunable range of between about 5.5 GHz to 6.5 GHz. A bus resonator total length of 9.928 cm will lead to the desired 6.0 GHz 8th order mode.

As seen in FIG. 5, there is a first Purcell filter 72 for the upper row of 8 transmons 70 and a second Purcell filter 74 in the lower row of 8 transmons 70. One reason for multiple filters is to avoid having a single long multi-mode Purcell filter with a small FSR to interface all of the readout resonators. A small FSR introduces extra Purcell losses via multiple modes of the lossy Purcell resonator filter. Furthermore, since there are 16 qubit readout resonators to distribute in the range from approximately 7.2 GHz to 7.7 GHz, the tight spacing between readout resonators can lead to finite hybridizations between readout resonators if all of the resonators are coupled to a common Purcell filter.

The strategy is to split the readout resonators spatially. The lower branch of resonators is distributed between about 7.2 GHz to about 7.6 GHz and coupled to one Purcell filter 74 while the upper branch is distributed between about 7.25 GHz to about 7.65 GHz and couple to a second Purcell filter 72. The readout resonators are thus not hybridized to influence single qubit measurements.

In addition, each Purcell filter 72, 74 is preferably implemented as a lossy meander CPW resonator over coupled to an external probe microwave waveguide. The resonance mode that corresponds to a passband should not only spectrally cover all eight readout resonators within a linewidth but also have an appropriate mode profile to allow readout resonators to be coupled with the filter efficiently. As the quarter-wavelength readout resonators are coupled to probe inductively at its voltage node (current antinode), the Purcell filter's voltage node (current antinode) is placed around the readout resonators. This is a phase-matched condition and can be realized with a Purcell filter as shown in FIG. 5.

In the embodiment shown, there are two branches (preferably spaced by more than 1.5 cm) of readout resonators to avoid hybridization between the 16 readout resonators. Each branch of readout resonators has its own Purcell filter and external probe line to interface with the external off-chip readout line. It is desirable to have the Purcell filter implemented as a low-Q coplanar-waveguide resonator to have resonance at the center of its branch's readout resonator spectral distribution with a large linewidth to cover the readout resonator frequency distribution of the branch.

Preferably a longer low-Q CPW resonator with a second order mode at the center of the branch's readout resonator spectral distribution is used. The second order mode has voltage nodes (current anti-nodes) covering the readout resonators (one current anti-node covers 4 readout resonators) as illustrated in FIG. 5.

Preferably a comparatively longer low-Q CPW resonator with its second order mode at the center of the branch's readout resonator spectral distribution is used. The second order mode has voltage nodes (current anti-nodes) covering the readout resonators (one current anti-node covers 4 readout resonators).

In one embodiment, the Purcell filters of each branch are fine tuned to have a second order center frequency at 7.4269 GHz with a total length of 1.94263749 cm and 7.4133 GHz with a total length of 1.94906164 cm for upper and lower branches respectively. These are right at the center of the designed readout resonator spectral distribution. This means that that the upper branch Purcell filter has a linewidth $\kappa/2\pi \approx 512$ MHz and the lower branch Purcell filter has $\kappa/2\pi \approx 509$ MHz. This leads to a Purcell filter second order mode quality factor of Q=14.5 for second order resonance 7.4 GHz.

Another feature of the Purcell filter 72, 74, is the incorporation of parallel plate capacitive coupling between the upper qubit-chip where the Purcell filter is located at and the low probe CPW that is located on the lower wiring-chip. There is a capacitive coupling 76 with the upper row of qubits and a second coupling 78 associated with the lower row of qubits. An illustrative structure of the capacitive couplings 76, 78 has an upper coupling capacitor plate and a lower probe capacitor plate separated by a 3-µm space between the capacitor plates. The size of the corresponding design overlap region produces a large capacitance of approximately 125 fF. This large capacitance further leads to an external coupling dominated linewidth of the Purcell filter to be about 500 MHz (Q~14) in this illustration.

Figure 6:
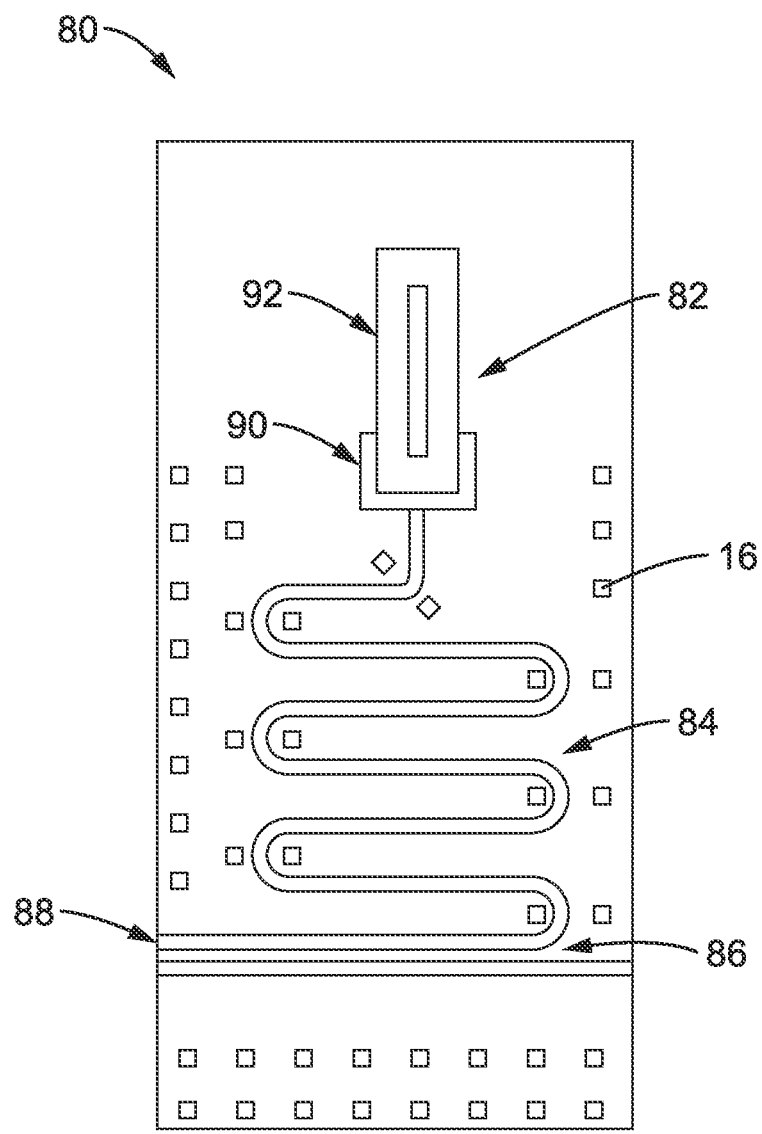
FIG. 6 is a detailed schematic top view of a single qubit with readout resonator and inductive coupling.

Turning now to FIG. 6, a top view of a single qubit 80 with transmon 82, readout resonator 84 and inductive coupling 86 and probe line 88 on a Q-chip is depicted. The readout resonator 84 has a generally "U" shaped cup or claw shaped readout 90 associated with the transmon 92 at one end and an induction coupling 86 with the probe line 88 at the other end. The dimensions of the claw shaped readout 90 and length of the meandering middle section of the readout resonator 84 can be modulated to produce the desired resonator frequencies and coupling rate etc.

For example, the coupling rate $$\frac{Gro}{2\pi}$$

between the transmon qubit and the associated readout resonator as well as the coupling rate $$\frac{Kex}{2\pi}$$

between the readout resonators and the Purcell filters can be optimized with the choice of dimensions. To optimize the coupling rate between the transmon qubit and the readout resonator, the length of the sides of the claw 90 around the qubit capacitor can be increased or decreased. In this illustration, an increase in the length of 20 µm of the cup 90 increased the capacitance with the qubit from 1.81 fF to 2.2 fF. At the same time, the coupling rate $$\frac{Gro}{2\pi}$$

between the transmon qubit and the readout resonator increased from 40 MHz to 47 MHz leading to a larger dispersive shift between different qubit frequency parking points and readout resonator frequencies.

The readout can also be modulated and optimized with an increase or decrease in dimensions. To allow a fast readout, for example, the coupling rate $$\frac{Kex}{2\pi}$$

between the readout resonators and the Purcell filter can be increased by increasing the mutual inductance between them at the induction coupling 86. This can be accomplished by decreasing the distance between the components of the induction coupling 86 (i.e. by decreasing the width of the ground metal between the coplanar waveguides).

For example, a decrease in the gap between the readout resonator inductive coupler segment and the probe waveguide 88 gap from 5 µm to 2.5 µm doubled the inductance from 14 nH to 30 nH. This change directly increased the coupling rate $$\frac{Kex}{2\pi}$$

from 650 kHz to 2.6 MHz, significantly decreasing the ring up time needed from driving the readout resonator to a steady state in photo occupation.

The readout resonators 80 are preferably designed one by one to have resonance frequencies uniformly spaced between about 7.23 GHz to about 7.64 GHz in two groups as shown in FIG. 2A and FIG. 5. These results may be obtained by finite-element-method simulations, for example. In one embodiment, the readout resonators in both upper and lower branches are indexed from the left to right with 1, 2, . . . , 8. It can be seen that the frequency of the $i^{th}$ resonator on the lower branch is close to the frequency of the (9-i)th resonator in the upper branch. This arrangement allows the placement of 16 readout resonators in a 400 MHz range without worrying about hybridization since the near degenerate resonators are not in the same branch and are normally spatially separated by more than about 1.1 cm to 1.9 cm. In the embodiment shown in FIG. 5, the lower set of resonators increase in resonator frequency moving from left to right while the upper set of resonators decrease in resonator frequency from left to right.

Figure 7:
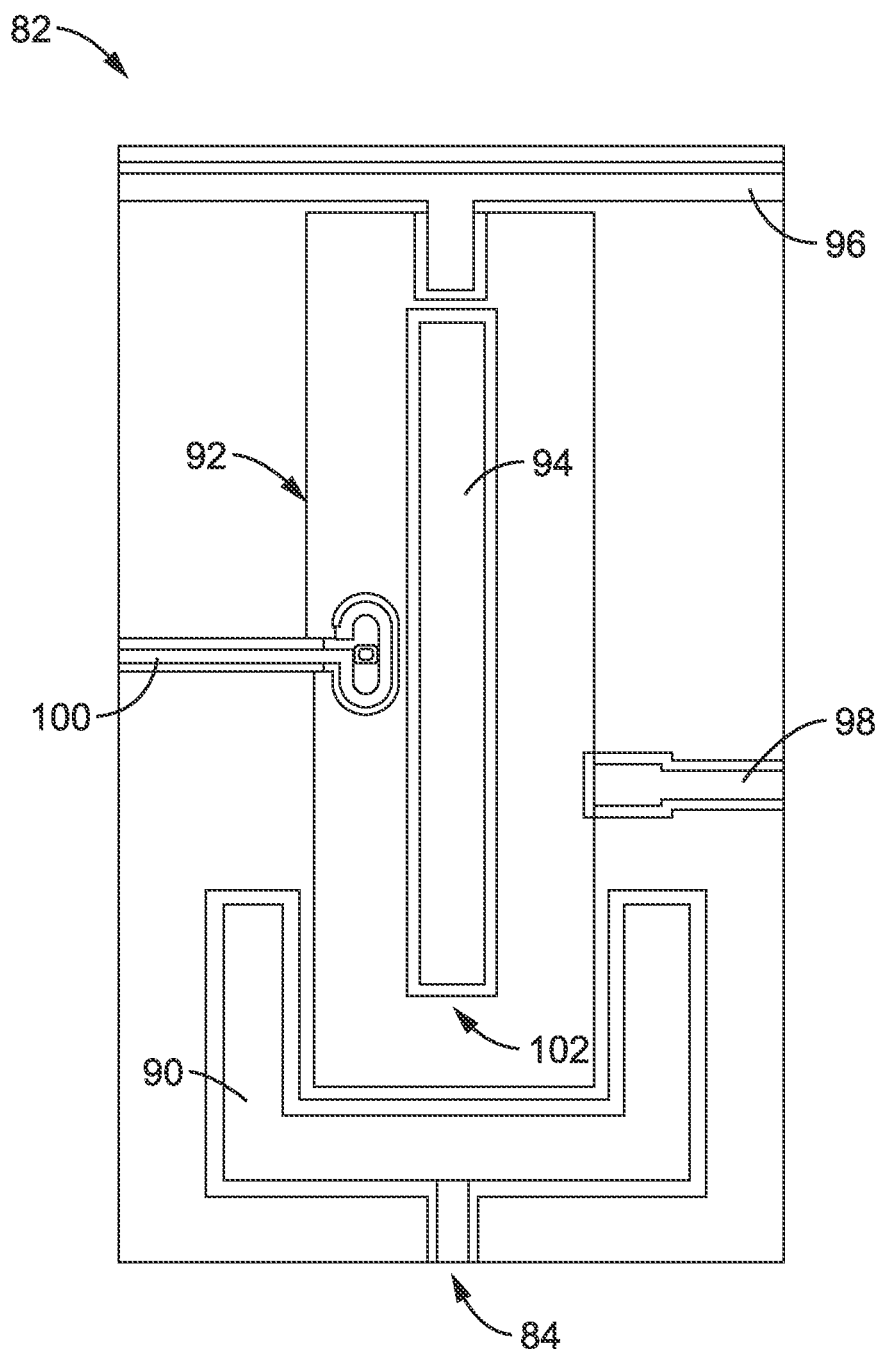
FIG. 7 is a detailed schematic view of the transmon configuration of the qubit of FIG. 6.

One embodiment of the preferred asymmetric junction transmon 92 of the qubit readout resonator 82 shown in FIG. 6 is detailed in FIG. 7. One end of the meandering readout resonator 84 has a claw shaped readout coupling capacitor 90 that is associated with and retains one end of transmon 92. The end of transmon 92 that is opposite the readout resonator coupling 90 is associated with the bus with the qubit bus coupling capacitor 96. The transmon 92 also contains the qubit ground capacitor 94, the single qubit XY-drive 98, and the qubit Z-control 100.

The transmons 82 are designed to be identical in geometric parameters since they are intended to be tunable by approximately 1 GHz. The finite tunability of the qubit transmons is realized with an asymmetric SQUID that is used for providing the necessary nonlinear inductance to bring the harmonicity of the microwave photon potential in the transmon 82. The SQUID 42, 44 provides tunable effective inductance. The range of achievable inductance is determined by the difference between the pair of Josephson junctions used in the SQUID.

In contrast to using a symmetric SQUID structure that leads to a large transmon frequency tuning range between a maximal flux insensitive point and near DC, the large asymmetry in the SQUID (and thus finite frequency tunability) leads to significantly reduced flux sensitivity of the tunable qubits. This directly increases the T2 coherence time of the qubits at points away from the flux insensitive maximal frequency point. This property is needed because qubits are strategically parked at desired spectral locations to maximally operate the reconfigurable connectivity functions of the system. However, these dynamically chosen frequency points are normally not at frequency insensitive points.

To improve the T1 time of the transmon qubit, the metal piece 102 directly facing the qubit readout resonator coupling capacitor 90 was removed in one embodiment. This piece 102 was removed because the metal-air interface can be lossy due to metal surface oxide and a parallel wiring-chip ground metal directly above the qubit capacitor can have relatively significant electric field energy participation near its surface. This opening in the wiring-chip ground plane increases the near field capacitance between XY-Drive and qubit capacitor as well as the capacitance between the bus resonator and the qubit. This can be viewed as a direct consequence of a more diffused lateral electric field distribution as the parallel capacitance (vertical field energy participation) between qubit and wiring-chip ground metal is eliminated.

From the description herein, it will be appreciated that the present disclosure encompasses multiple implementations which include, but are not limited to, the following:

A superconducting quantum processor unit apparatus for quantum computing, the apparatus comprising: (a) a qubit chip, comprising: (i) a planar substrate with a plurality of surface bonding elements; (ii) a plurality of qubits; and (iii) a probe line inductively coupled to the qubits; (b) a wiring chip, comprising: (i) a planar substrate with a plurality of surface bonding elements; (ii) a bus coupling resonator with a plurality of voltage nodes and anti-nodes; (iii) at least one SQUID joined to the bus coupling resonator; and (iv) a resonator pump connected to the bus coupling resonator through pump capacitors at the voltage anti-nodes; (c) wherein the qubit chip is mounted to the wiring chip with the surface bonding elements to produce a superconducting quantum processor unit.

The apparatus of any preceding or following implementation, wherein each of the qubits comprise: a transmon; and a meandering readout resonator with a readout capacitor engaged with the transmon at one end and coupled to the probe line at the other with an inductive coupling; wherein the readout resonator is configured to produce a set resonator frequency.

The apparatus of any preceding or following implementation, wherein each transmon comprises: a qubit pad with a qubit ground capacitor; a bus coupling capacitor; a qubit XY control; and a qubit Z control.

The apparatus of any preceding or following implementation, the probe line further comprising: a Purcell filter; and a parallel capacitor.

The apparatus of any preceding or following implementation, wherein the resonator pump further comprises waveguides positioned between each pump coupling capacitors creating a phase delay.

The apparatus of any preceding or following implementation, wherein the bonding elements of the qubit chip and the wiring chip comprise superconducting indium metal pillars distributed around the planar substrate for crosstalk suppression.

The apparatus of any preceding or following implementation, wherein the bonding elements of the qubit chip and the wiring chip further comprise a plurality of low-loss superconducting/dielectric hard spacers (e.g. niobium).

A superconducting quantum processor unit apparatus for quantum computing, the apparatus comprising: (a) a wiring chip, comprising: (i) a planar substrate with a plurality of surface bonding elements; (ii) a bus coupling resonator with a first row of a plurality of voltage nodes and anti-nodes coupled to a second row of a plurality of voltage nodes and anti-nodes parallel to the first row and separated by a gap; (iii) a resonator pump disposed in the gap between the rows of voltage nodes, the resonator pump connected to each row of the bus coupling resonator through pump capacitors at the voltage anti-nodes of the first and second rows of nodes of the bus coupling resonator; and (iv) a first SQUID joined to the first row of voltage nodes and anti-nodes of the bus coupling resonator; and (v) a second SQUID joined to the second row of voltage nodes and anti-nodes of the bus coupling resonator; (b) a qubit chip, comprising: (i) a planar substrate with a plurality of surface bonding elements with a distribution corresponding to the bonding elements of the wiring chip; (ii) a first row of a plurality of qubits inductively coupled to a first probe line; and (iii) a second row of a plurality of qubits inductively coupled to a second probe line; (c) wherein the qubit chip is mounted to the wiring chip with the surface bonding elements to produce a superconducting quantum processor unit.

The apparatus of any preceding or following implementation, the first probe line and the second probe line further comprising: a Purcell filter; and a parallel capacitor.

The apparatus of any preceding or following implementation, wherein each of the qubits comprise: a transmon; and a meandering readout resonator with a readout capacitor engaged with the transmon at one end and coupled to the probe line at the other with an inductive coupling; wherein the readout resonator is configured to produce a set resonator frequency.

The apparatus of any preceding or following implementation, wherein the set resonator frequency of the qubits in the first and second rows of qubits incrementally increases from one end of a row to the other.

The apparatus of any preceding or following implementation, wherein each transmon comprises: a qubit pad with a qubit ground capacitor; a bus coupling capacitor; a qubit XY control; and a qubit Z control.

The apparatus of any preceding or following implementation, wherein the resonator pump further comprises waveguides positioned between each of the pump coupling capacitors creating a phase delay; and wherein voltage phases of resonant anti-nodes are aligned with a travelling wave injected into the bus drive line resonator pump.

The apparatus of any preceding or following implementation, wherein the bonding elements of the qubit chip and the wiring chip comprise superconducting indium metal pillars distributed around the planar substrate for crosstalk suppression.

The apparatus of any preceding or following implementation, wherein the bonding elements of the qubit chip and the wiring chip further comprise a plurality of low-loss superconducting/dielectric hard spacers.

A superconducting quantum processor unit apparatus for quantum computing, the apparatus comprising: (a) a wiring chip, comprising: (i) a planar substrate with a plurality of surface bonding elements; (ii) a bus coupling resonator with a first row of four voltage nodes and anti-nodes coupled to a second row of four voltage nodes and anti-nodes parallel to the first row and separated by a gap, the anti-nodes facing the gap; (iii) a resonator pump disposed in the gap between the rows of voltage anti-nodes of the bus coupling resonator, the resonator pump having a drive line and pairs of opposing pump coupling capacitors coupled to anti-nodes of the bus coupling resonator and a waveguide positioned between each pair of pump coupling capacitors; (iv) a first SQUID joined to an end of the first row of voltage nodes and anti-nodes of the bus coupling resonator; and (v) a second SQUID joined to an end of the second row of voltage nodes and anti-nodes of the bus coupling resonator; (b) a qubit chip, comprising: (i) a planar substrate with a plurality of surface bonding elements with a distribution corresponding to the bonding elements of the wiring chip; (ii) a first row of a plurality of qubits inductively coupled to a first probe line; and (iii) a second row of a plurality of qubits inductively coupled to a second probe line; (c) wherein the qubit chip is mounted to the wiring chip with the surface bonding elements to produce a superconducting quantum processor unit.

The apparatus of any preceding or following implementation, the first probe line and the second probe line further comprising: a Purcell filter; and a parallel capacitor.

The apparatus of any preceding or following implementation, wherein each of the qubits comprise: a transmon; and a meandering readout resonator with a readout capacitor engaged with the transmon at one end and coupled to the probe line at the other with an inductive coupling; wherein the readout resonator is configured to produce a set resonator frequency.

The apparatus of any preceding or following implementation, wherein each transmon comprises: a qubit pad with a qubit ground capacitor; a bus coupling capacitor; a qubit XY control; and a qubit Z control.

The apparatus of any preceding or following implementation, wherein the bonding elements of the qubit chip and the wiring chip comprise superconducting indium metal pillars distributed around the planar substrate for crosstalk suppression.

As used herein, term "implementation" is intended to include, without limitation, embodiments, examples, or other forms of practicing the technology described herein.

As used herein, the singular terms "a," "an," and "the" may include plural referents unless the context clearly dictates otherwise. Reference to an object in the singular is not intended to mean "one and only one" unless explicitly so stated, but rather "one or more."

Phrasing constructs, such as "A, B and/or C", within the present disclosure describe where either A, B, or C can be present, or any combination of items A, B and C. Phrasing constructs indicating, such as "at least one of" followed by listing a group of elements, indicates that at least one of these group elements is present, which includes any possible combination of the listed elements as applicable.

References in this disclosure referring to "an embodiment", "at least one embodiment" or similar embodiment wording indicates that a particular feature, structure, or characteristic described in connection with a described embodiment is included in at least one embodiment of the present disclosure. Thus, these various embodiment phrases are not necessarily all referring to the same embodiment, or to a specific embodiment which differs from all the other embodiments being described. The embodiment phrasing should be construed to mean that the particular features, structures, or characteristics of a given embodiment may be combined in any suitable manner in one or more embodiments of the disclosed apparatus, system, or method.

As used herein, the term "set" refers to a collection of one or more objects. Thus, for example, a set of objects can include a single object or multiple objects.

Relational terms such as first and second, top and bottom, and the like may be used solely to distinguish one entity or action from another entity or action without necessarily requiring or implying any actual such relationship or order between such entities or actions.

The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element.

As used herein, the terms "approximately", "approximate", "substantially", "essentially", and "about", or any other version thereof, are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" aligned can refer to a range of angular variation of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

The term "coupled" as used herein is defined as connected, although not necessarily directly and not necessarily mechanically. A device or structure that is "configured" in a certain way is configured in at least that way, but may also be configured in ways that are not listed.

Benefits, advantages, solutions to problems, and any element(s) that may cause any benefit, advantage, or solution to occur or become more pronounced are not to be construed as a critical, required, or essential features or elements of the technology describes herein or any or all the claims.

In addition, in the foregoing disclosure various features may grouped together in various embodiments for the purpose of streamlining the disclosure. This method of disclosure is not to be interpreted as reflecting an intention that the claimed embodiments require more features than are expressly recited in each claim. Inventive subject matter can lie in less than all features of a single disclosed embodiment.

The abstract of the disclosure is provided to allow the reader to quickly ascertain the nature of the technical disclosure. It is submitted with the understanding that it will not be used to interpret or limit the scope or meaning of the claims.

It will be appreciated that the practice of some jurisdictions may require deletion of one or more portions of the disclosure after that application is filed. Accordingly the reader should consult the application as filed for the original content of the disclosure. Any deletion of content of the disclosure should not be construed as a disclaimer, forfeiture, or dedication to the public of any subject matter of the application as originally filed.

The following claims are hereby incorporated into the disclosure, with each claim standing on its own as a separately claimed subject matter.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A superconducting quantum processor unit apparatus for quantum computing, the apparatus comprising:
   (a) a qubit chip, comprising:
      (i) a planar substrate with a plurality of qubit chip surface bonding elements;
      (ii) a plurality of qubits; and
      (iii) a probe line inductively coupled to the qubits;
   (b) a wiring chip, comprising:
      (i) a planar substrate with a plurality of wiring chip surface bonding elements;
      (ii) a bus coupling resonator with a plurality of voltage nodes and anti-nodes;
      (iii) at least one Superconducting-Quantum-Interference-Device (SQUID) joined to the bus coupling resonator; and
      (iv) a resonator pump connected to said bus coupling resonator through pump capacitors at said voltage anti-nodes;
   (c) wherein said qubit chip is mounted to said wiring chip with the surface bonding elements of each chip to produce a superconducting quantum processor unit.

2. The apparatus of claim 1, wherein each of said qubits comprise:
   a transmon; and
   a meandering readout resonator with a readout capacitor engaged with the transmon at one end and coupled to the probe line at the other with an inductive coupling;
   wherein said readout resonator is configured to produce a set resonator frequency.

3. The apparatus of claim 2, wherein each transmon comprises:
   a qubit pad with a qubit ground capacitor;
   a bus coupling capacitor;
   a qubit XY control; and
   a qubit Z control.

4. The apparatus of claim 1, said probe line further comprising:
   a Purcell filter; and
   a parallel capacitor.

5. The apparatus of claim 1, wherein said resonator pump further comprises waveguides positioned between each pump coupling capacitor creating a phase delay.

6. The apparatus of claim 1, wherein said bonding elements of said qubit chip and said wiring chip comprise superconducting indium metal pillars distributed around the planar substrate for crosstalk suppression.

7. The apparatus of claim 6, wherein said bonding elements of said qubit chip and said wiring chip further comprise a plurality of low-loss superconducting/dielectric hard spacers.

8. A superconducting quantum processor unit apparatus for quantum computing, the apparatus comprising:
   (a) a wiring chip, comprising:
      (i) a planar substrate with a plurality of wiring chip surface bonding elements;
      (ii) a bus coupling resonator with a first row of a plurality of voltage nodes and anti-nodes coupled to a second row of a plurality of voltage nodes and anti-nodes parallel to the first row and separated by a gap;
      (iii) a resonator pump disposed in said gap between said rows of voltage nodes, said resonator pump connected to each row of said bus coupling resonator through pump capacitors at said voltage anti-nodes of said first and second rows of nodes of the bus coupling resonator; and (iv) a first Superconducting-Quantum-Interference-Device (SQUID) joined to the first row of voltage nodes and anti-nodes of the bus coupling resonator; and (v) a second Superconducting-Quantum-Interference-Device (SQUID) joined to the second row of voltage nodes and anti-nodes of the bus coupling resonator;

(b) a qubit chip, comprising:
(i) a planar substrate with a plurality of qubit chip surface bonding elements with a distribution corresponding to said bonding elements of said wiring chip;
(ii) a first row of a plurality of qubits inductively coupled to a first probe line; and
(iii) a second row of a plurality of qubits inductively coupled to a second probe line;

(c) wherein said qubit chip is mounted to said wiring chip with the surface bonding elements to produce a superconducting quantum processor unit.

9. The apparatus of claim 8, said first probe line and said second probe line further comprising:
a Purcell filter; and
a parallel capacitor.

10. The apparatus of claim 8, wherein each of said qubits comprises:
a transmon; and
a meandering readout resonator with a readout capacitor engaged with the transmon at one end and coupled to the first or second probe line at the other with an inductive coupling;
wherein said readout resonator is configured to produce a set resonator frequency.

11. The apparatus of claim 10, wherein said set resonator frequency of said qubits in said first and second rows of qubits incrementally increases from one end of a row to the other.

12. The apparatus of claim 10, wherein each transmon comprises:
a qubit pad with a qubit ground capacitor;
a bus coupling capacitor;
a qubit XY control; and
a qubit Z control.

13. The apparatus of claim 8, wherein said resonator pump further comprises waveguides positioned between pump capacitors creating a phase delay; and
wherein voltage phases of resonant anti-nodes are aligned with a travelling wave injected into the bus drive line resonator pump.

14. The apparatus of claim 8, wherein said bonding elements of said qubit chip and said wiring chip comprise superconducting indium metal pillars distributed around the planar substrate for crosstalk suppression.

15. The apparatus of claim 14, wherein said bonding elements of said qubit chip and said wiring chip further comprise a plurality of low-loss superconducting/dielectric hard spacers.

16. A superconducting quantum processor unit apparatus for quantum computing, the apparatus comprising:
(a) a wiring chip, comprising:
(i) a planar substrate with a plurality of wiring chip surface bonding elements;
(ii) a bus coupling resonator with a first row of four voltage nodes and anti-nodes coupled to a second row of four voltage nodes and anti-nodes parallel to the first row and separated by a gap, said anti-nodes facing the gap;
(iii) a resonator pump disposed in said gap between said rows of voltage anti-nodes of said bus coupling resonator, said resonator pump having a drive line and pairs of opposing pump coupling capacitors coupled to anti-nodes of the bus coupling resonator and a waveguide positioned between each pair of pump coupling capacitors;
(iv) a first Superconducting-Quantum-Interference-Device (SQUID) joined to an end of the first row of voltage nodes and anti-nodes of the bus coupling resonator; and
(v) a second Superconducting-Quantum-Interference-Device (SQUID) joined to an end of the second row of voltage nodes and anti-nodes of the bus coupling resonator;

(b) a qubit chip, comprising:
(i) a planar substrate with a plurality of qubit chip surface bonding elements with a distribution corresponding to said bonding elements of said wiring chip;
(ii) a first row of a plurality of qubits inductively coupled to a first probe line; and
(iii) a second row of a plurality of qubits inductively coupled to a second probe line;

(c) wherein said qubit chip is mounted to said wiring chip with the wiring chip and qubit surface bonding elements to produce a superconducting quantum processor unit.

17. The apparatus of claim 16, said first probe line and said second probe line further comprising:
a Purcell filter; and
a parallel capacitor.

18. The apparatus of claim 16, wherein each of said qubits comprises:
a transmon; and
a meandering readout resonator with a readout capacitor engaged with the transmon at one end and coupled to the first or second probe line at the other with an inductive coupling;
wherein said readout resonator is configured to produce a set resonator frequency.

19. The apparatus of claim 18, wherein each transmon comprises:
a qubit pad with a qubit ground capacitor;
a bus coupling capacitor;
a qubit XY control; and
a qubit Z control.

20. The apparatus of claim 16, wherein said bonding elements of said qubit chip and said wiring chip comprise superconducting indium metal pillars distributed around the planar substrates of the qubit chip and the wiring chip for crosstalk suppression.

* * * * *